(12) United States Patent
Son et al.

(10) Patent No.: US 8,588,865 B2
(45) Date of Patent: Nov. 19, 2013

(54) METHOD AND APPARATUS FOR REMOVING ACOUSTIC INCIDENT SIGNAL

(75) Inventors: Beak-kwon Son, Suwon-si (KR); Dong-won Lee, Suwon-si (KR); Jae-hyun Kim, Suwon-si (KR); Sang-ki Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 342 days.

(21) Appl. No.: 12/872,605

(22) Filed: Aug. 31, 2010

(65) Prior Publication Data

US 2011/0171921 A1    Jul. 14, 2011

(30) Foreign Application Priority Data

Jan. 12, 2010 (KR) .................. 10-2010-0002751

(51) Int. Cl.
*H04B 1/38* (2006.01)
*H04K 3/00* (2006.01)

(52) U.S. Cl.
USPC ........................................ 455/570; 381/71.1

(58) Field of Classification Search
USPC ........ 455/296, 303, 308, 570; 380/71.1, 71.8, 380/71.14; 381/71.1, 71.8, 71.14
See application file for complete search history.

(56) References Cited

U.S. PATENT DOCUMENTS

| 5,579,404 A | * | 11/1996 | Fielder et al. ................. 381/106 |
| 2006/0147049 A1 | * | 7/2006 | Bayley et al. ................... 381/56 |
| 2008/0025494 A1 | | 1/2008 | Zaluaga |

* cited by examiner

*Primary Examiner* — Lee Nguyen
(74) *Attorney, Agent, or Firm* — Sughrue Mion, PLLC

(57) ABSTRACT

A method of removing a signal from among received signals, the method including: filtering the received signals; detecting a time band of the filtered received signals where an energy value of the filtered received signals exceeds a reference energy value; and applying a gain value to one or more received signals, from among the received signals, in the detected time band.

19 Claims, 4 Drawing Sheets

METHOD AND APPARATUS FOR REMOVING ACOUSTIC INCIDENT SIGNAL

CROSS-REFERENCE TO RELATED PATENT APPLICATION

This application claims priority from Korean Patent Application No. 10-2010-0002751, filed on Jan. 12, 2010 in the Korean Intellectual Property Office, the disclosure of which is incorporated herein in its entirety by reference.

BACKGROUND

1. Field

Methods and apparatuses consistent with exemplary embodiments relate to a method and apparatus for removing a signal, and more particularly, to a method and apparatus for effectively removing an acoustic incident signal by decreasing a reference energy value by using a frequency weighting filter.

2. Description of the Related Art

An unexpected acoustic incident may occur while talking to another person through a digital device, such as a mobile terminal or an Internet phone. The acoustic incident refers to a large noise that is suddenly heard during a phone call. When exposed to the acoustic incident, a user experiences a symptom, such as acoustic damage, temporary acoustic disability, or a headache, which is called an acoustic shock.

In order to remove the acoustic incident that may occur during the phone call, a technology which removes a tone signal having a large volume that exceeds a predetermined reference value is used. However, in an actual digital device, the acoustic incident is generated in the overall frequency band in the form of white noise, instead of in the form of the tone signal. Accordingly, the technology which removes the tone signal having the large volume cannot effectively remove the acoustic incident generated during the phone call.

SUMMARY

Exemplary embodiments provide a method and apparatus for removing an acoustic incident signal that is generated during a phone call by reducing a reference energy value using a frequency weighting filter.

According to an aspect of an exemplary embodiment, there is provided a method of removing a signal from among received signals, the method including: filtering the received signals; detecting a time band of the filtered received signals where an energy value of the filtered received signals exceeds a reference energy value; and applying a gain value to one or more received signals, from among the received signals, in the detected time band.

The filtering the received signals may include filtering the received signals by using a frequency weighting filter.

The frequency weighting filter may apply increasing weights from a low frequency band to a high frequency band, wherein the weight may be a positive real number less than or equal to 1.

The filtering the received signals may include filtering the received signals in a frequency band of 4 KHz or lower by using the frequency weighting filter.

The method may further include outputting the one or more received signals to which the gain value is applied and remaining received signals having an energy value that does not exceed the reference energy value after being filtered, together.

The detecting the time band may include: calculating an average energy value of the filtered received signals in a time domain, according to frames; and detecting a time band of a frame in which the average energy value of the filtered received signals is greater than the reference energy value.

The method may further include calculating a value for adjusting the average energy value of the filtered received signals to the reference energy value in the detected time band, according to frames, wherein the applying the gain value may include applying the calculated value on the received signals in each frame as the gain value.

The gain value may be a positive real number less than 1.

According to an aspect of another exemplary embodiment, there is provided an apparatus for removing a signal from among received signals, the apparatus including: a filter unit which filters the received signals; an acoustic incident signal section detecting unit which detects a time band of the filtered received signals where an energy value of the filtered received signals exceeds a reference energy value; and a gain applying unit which applies a gain value to one or more received signals, from among the received signals, in the detected time band.

According to an aspect of another exemplary embodiment, there is provided a computer readable recording medium having recorded thereon a program for executing a method of removing a signal from among received signals, the method including: filtering the received signals; detecting a time band of the filtered received signals where an energy value of the filtered received signals exceeds a reference energy value; and applying a gain value to one or more received signals, from among the received signals, in the detected time band.

According to an aspect of another exemplary embodiment, there is provided a method of removing a signal from among received signals, the method including: filtering the received signals; detecting a time band of the filtered received signals where an energy value of the filtered received signals exceeds a reference energy value; and reducing a volume of a signal, from among the received signals, at the detected time band to be less than another signal that is not at the detected time band.

BRIEF DESCRIPTION OF THE DRAWINGS

The above and other features and advantages will become more apparent by describing in detail exemplary embodiments thereof with reference to the attached drawings in which.

DETAILED DESCRIPTION OF EXEMPLARY EMBODIMENTS

Figure 1:
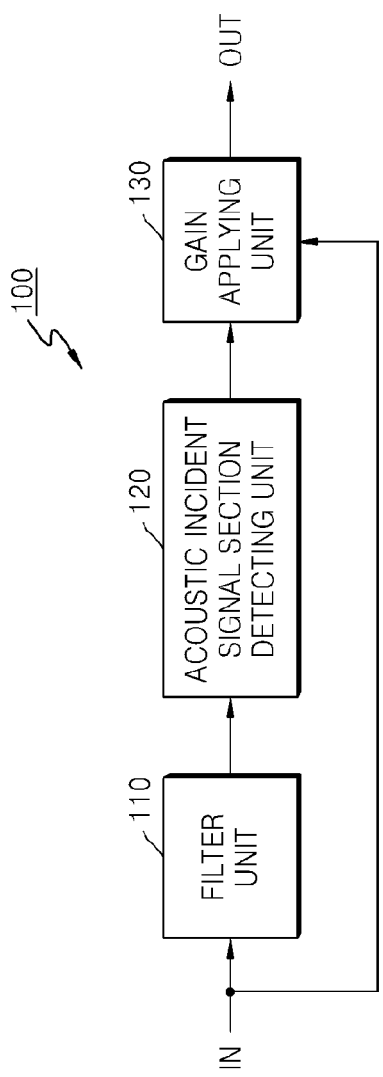
FIG. 1 is a block diagram illustrating an apparatus for removing an acoustic incident signal, according to an exemplary embodiment.

Hereinafter, exemplary embodiments will be described more fully with reference to the accompanying drawings, in which like reference numerals refer to like elements throughout.

FIG. 1 is a block diagram illustrating an apparatus 100 for removing an acoustic incident signal, according to an exemplary embodiment. Referring to FIG. 1, the apparatus 100 includes a filter unit 110, an acoustic incident signal section detecting unit 120, and a gain applying unit 130.

The filter unit 110 filters signals received from another terminal through a receiving terminal, such as a phone. The filter unit 110 applies, on the received signals, a frequency weighting filter for different weights according to frequency bands.

While the received signals heard from the receiving terminal are transmitted from the ear hole to the eardrum, resonance due to an ear canal is generated near 3 KHz. Thus, during a phone call, an ear of a person is sensitive to a signal in a frequency band from 1 KHz to 4 KHz. In such a frequency band from 1 KHz to 4 KHz, voice signals of a person are mainly distributed in a low frequency band of 2 KHz or below, and acoustic incident signals are mainly distributed in a middle and high frequency band of 2 KHz or above. In other words, the voice signals and the acoustic incident signals exist in different frequency bands.

According to the current exemplary embodiment, a voice signal and an acoustic incident signal are separated from each other based on the fact that the voice signal and the acoustic incident signal are mainly distributed in different frequency bands. In other words, the filter unit 110 gives different weights to the voice signal and the acoustic incident signal by using the frequency weighting filter giving different weights according to frequency bands.

Here, the weight may be a real number equal to or smaller than 1. Also, the frequency weighting filter used by the filter unit 110 may give a higher weight from a low frequency band to a high frequency band. In other words, the filter unit 110 may give a high weight closer to 1 to a signal in the high frequency band near 4 KHz, and give a low weight closer to 0 to a signal in the low frequency band near 0 Hz, thereby passing through the acoustic incident signal, from among the received signals, which is distributed in the high frequency band as the acoustic incident signal is, and reducing the size of the voice signal, from among the received signals, which is distributed in the low frequency band. Accordingly, when the received signals pass through the filter unit 110, the acoustic incident signal in the high frequency band is output as the acoustic incident signal and the voice signal in the low frequency band is output with a reduced size. Thus, a size difference between the voice signal and the acoustic incident signal is increased.

As described above, the ear of the person is sensitive to a signal in a frequency band of 4 KHz or lower. Accordingly, unlike an audio speaker (not shown), a speaker (not shown) for outputting a phone call signal generally has a frequency band of 4 KHz or lower. Accordingly, the frequency weighting filter used by the filter unit 110 may also be applied to a signal in a frequency band of 4 KHz or lower.

The filter unit 110 transmits the filtered received signals to the acoustic incident signal section detecting unit 120.

The acoustic incident signal section detecting unit 120 converts the filtered received signal in a frequency domain to a signal in a time domain. Furthermore, the acoustic incident signal section detecting unit 120 detects a time section in which the acoustic incident signal exists, from the filtered received signals.

In order to detect the time section from the filtered received signals, the acoustic incident signal section detecting unit 120 divides the filtered received signals according to frames, and calculates an average energy value by calculating a root mean square (RMS) of the filtered received signals in each frame.

The average energy value according to frames may be obtained by Equation 1 below:

$$\sqrt{\frac{1}{N}\sum_{i=1}^{N} x^2(i)},$$ [Equation 1]

where x(i) denotes a received signal filtered by the frequency weighting filter, and N is a frame size for calculating the RMS.

The acoustic incident signal section detecting unit 120 compares the average energy value obtained according to frames with a fixed threshold value, i.e., a predetermined reference energy value. When the average energy value exceeds the reference energy value, the acoustic incident signal section detecting unit 120 determines that the filtered received signal in the frame having that average energy value is the acoustic incident signal. The acoustic incident signal section detecting unit 120 calculates a time value of the frame including the filtered received signal having the average energy value higher than the reference energy value.

The reference energy value may differ based on the filtered received signal having the average energy value that will be determined as the acoustic incident signal. Also, the reference energy value may differ according to a type of the frequency weighting filter used by the filter unit 110. By using the frequency weighting filter that gives a smaller weight to the voice signal in the low frequency band, the size of the voice signal in the low frequency band is reduced more than the original size. Accordingly, the acoustic incident signal section detecting unit 120 may use a smaller reference energy value to classify whether the filtered received signal is the acoustic incident signal or the voice signal. As the reference energy value decreases, the acoustic incident signal is easily detected.

The acoustic incident signal section detecting unit 120 determines a value for reducing the average energy value that is greater than the reference energy value, i.e., determines a value for reducing the average energy value of the filtered received signal determined to be the acoustic incident signal to the reference energy value as a gain value. The gain value may be a real number between 0 and 1 to reduce the average energy value of the acoustic incident signal to the reference energy value.

The acoustic incident signal section detecting unit 120 obtains a time band of the acoustic incident signal in a frame unit. Since the average energy value of the acoustic incident signal may differ according to frames, the gain value for reducing the average energy value of the acoustic incident signal to the reference energy value may also differ according to frames. Accordingly, the acoustic incident signal section detecting unit 120 may obtain the gain value according to frames.

The acoustic incident signal section detecting unit 120 provides, to the gain applying unit 130, the time band of the acoustic incident signal having the higher average energy value than the reference energy value from among the filtered received signals, and the gain values to be applied to each frame.

The gain applying unit 130 receives information about the time band and the gain values to be applied to each frame from the acoustic incident signal section detecting unit 120. Also, the gain applying unit 130 receives the received signals that do not pass through the filter unit 110. The gain applying unit 130 applies the gain values to the received signals by using the information received from the acoustic incident signal section detecting unit 120. In other words, the gain applying unit 130 adjusts the size of the acoustic incident signal by applying the gain values according to frames to the received signals in the corresponding frame.

Since the filter unit 110 filters the acoustic incident signal that is mostly distributed in middle and high frequency bands by giving the acoustic incident signal a relatively higher weight (e.g., a weight close to 1), energy values of the received signal in the middle and high frequency bands before and after being filtered by the filter unit 110 are similar. Accordingly, when the gain value for reducing the average energy value of the filtered received signal to the reference energy value is applied to the received signal, the size of the received signal in the middle and high frequency bands, which are multiplied by the gain value, is similar to the reference energy value.

Since the average energy value of the signal in the low frequency band from among the filtered received signals does not exceed the reference energy value, the received signal in the low frequency band is not multiplied by the gain value. Accordingly, the voice signal that is mostly distributed in the low frequency band maintains its original size.

By applying the frequency weighting filter on the received signals, the size of the voice signal is reduced, and thus the reference energy value is also reduced according to the reduced size of the voice signal. In this case, the acoustic incident signal is multiplied by a decreased gain value to reduce the average energy value of the acoustic incident signal to the reference energy value. As described above, the gain value is a real number between 0 and 1.

As described above, the size of the voice signal from among the received signals is maintained, while the size of the acoustic incident signal from among the received signals is reduced to the reference energy value by being multiplied by the gain value. Accordingly, when the received signals pass through the gain applying unit 130, the size of the acoustic incident signal is less than the size of the voice signal.

As such, according to the current exemplary embodiment, the energy value of the voice signal in the low frequency band from among the received signals may be reduced by using the frequency weighting filter. Also, since the energy value of the voice signal is reduced, the reference energy value for separating the acoustic incident signal and the voice signal from each other may be small.

Also, according to the current exemplary embodiment, the value for reducing the energy value of the acoustic incident signal in the middle and high frequency bands to the reference energy value is obtained as the gain value, and the gain value is applied to the received signals. Thus, the energy size of the acoustic incident signal may be smaller than that of the voice signal, from among the received signals.

Figure 2:
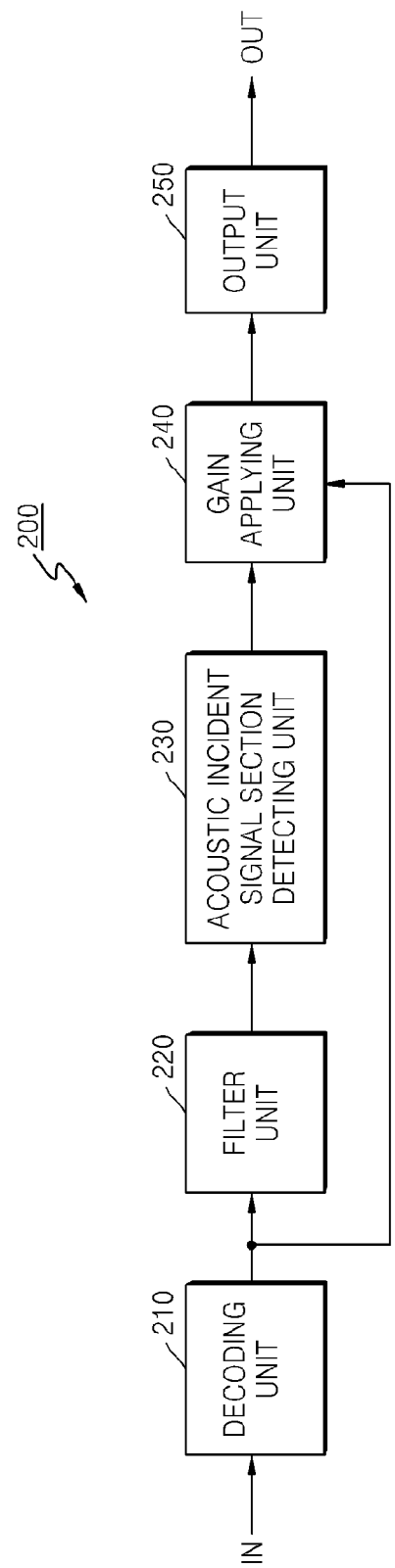
FIG. 2 is a block diagram illustrating an apparatus for removing an acoustic incident signal, according to another exemplary embodiment.

FIG. 2 is a block diagram illustrating an apparatus 200 for removing an acoustic incident signal, according to another exemplary embodiment. Referring to FIG. 2, the apparatus 200 includes a decoding unit 210, a filter unit 220, an acoustic incident signal section detecting unit 230, a gain applying unit 240, and an output unit 250. The filter unit 220, the acoustic incident signal section detecting unit 230, and the gain applying unit 240 of the apparatus 200 are respectively similar to the filter unit 110, the acoustic incident signal section detecting unit 120, and the gain applying unit 130 of the apparatus 100, and thus detailed descriptions thereof will not be repeated.

The decoding unit 210 restores pulse code modulation (PCM) signals by decoding encoded signals received through a digital device, such as a mobile terminal or an Internet phone. The decoding unit 210 transmits the PCM signals to each of the filter unit 220 and the gain applying unit 240.

The filter unit 220 filters the PCM signals by using a frequency weighting filter, and transmits the filtered PCM signals to the acoustic incident signal section detecting unit 230.

The acoustic incident signal section detecting unit 230 obtains an energy value of each of the filtered PCM signals in frame units. Furthermore, the acoustic incident signal section detecting unit 230 obtains a frame of a signal having an average energy value greater than a reference energy value, from among the filtered PCM signals, and provides, to the gain applying unit 240, a time band of the obtained frame. Also, the acoustic incident signal section detecting unit 230 obtains a gain value for adjusting the energy value of the filtered PCM signals in the time band in which the average energy value is greater than the reference energy value, to the reference energy value in a frame unit, and provides, to the gain applying unit 240, the gain value.

The gain applying unit 240 receives the decoded PCM signal from the decoding unit 210, and receives information about the time band and the gain value to be applied to the PCM signals in the time band from the acoustic incident signal section detecting unit 230. The gain applying unit 240 applies the gain value to the PCM signals according to frames. Furthermore, the gain applying unit 240 transmits the PCM signals multiplied by the gain value to the output unit 250. Since a voice signal from among the PCM signals is not multiplied by the gain value, the gain applying unit 240 transmits the PCM signal, i.e., an acoustic incident signal, which is multiplied by the gain value, and the voice signal to which the gain value is not applied to the output unit 250.

The output unit 250 converts a digital signal to an analog signal, and outputs the analog signal through a speaker (not shown). The output unit 250 outputs the acoustic incident signal to which the gain value is applied and the voice signal to which the gain value is not applied together.

Figure 3:
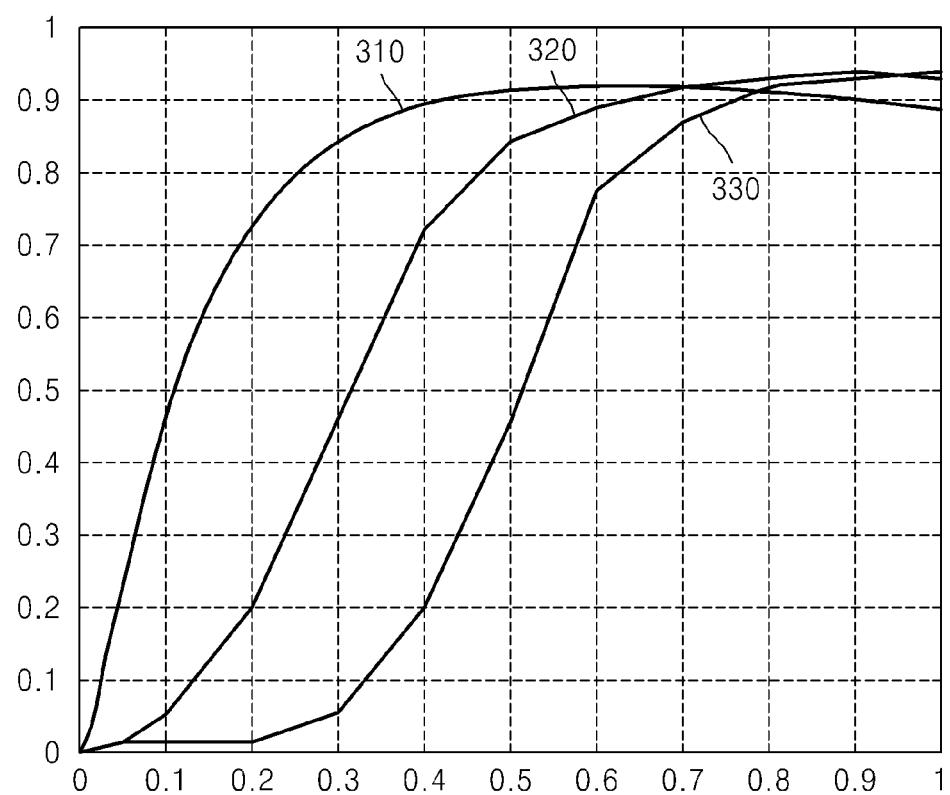
FIG. 3 is a graph for describing frequency characteristics of a frequency weighting filter used in a filter unit of FIG. 1 or 2.

FIG. 3 is a graph for describing frequency characteristics of the frequency weighting filter used in the filter unit 110 or 220 of FIG. 1 or 2. Referring to FIG. 3, a horizontal axis indicates a frequency and a vertical axis indicates a weight. The weight is a real number less than or equal to 1, and the frequency is normalized to 1.

Referring to the graph of FIG. 3, it can be seen that the frequency weighting filter applies different weights to received signals according to frequency bands. In the graph of FIG. 3, a weight applied to a signal in middle and high frequency bands is closer to 1, and a weight applied to a signal in a low frequency band is less than 1 and closer to 0. In other words, the weight applied to the received signals is increased from the low frequency band to the high frequency band.

Accordingly, when the frequency weighting filter according to FIG. 3 is applied to the received signals, an energy size of a voice signal, which is mostly distributed in the low frequency band, is reduced, and an energy size of an acoustic incident signal, which is mostly distributed in the middle and high frequency bands, is maintained.

The graph of FIG. 3 includes three plot lines 310, 320, and 330. A weight applied to a signal in the low frequency band decreases from the first plot line 310 to the third plot line 330. As an example, a manufacturer or a user of the apparatus 100 or 200 may select a frequency weighting filter for the apparatus 100 or 200, from among various types of frequency weighting filters. The frequency weighting filter may be selected based on whether the frequency weighting filter is to be used alone or to be installed in a device, and frequency response characteristics in a speaker according to a sound quality tuning filter. The manufacturer or user may select the frequency weighting filter that minimizes a distortion of a voice in a general phone call while maximizing an output limitation of an acoustic incident signal, for the apparatus 100 or 200.

Figure 4:
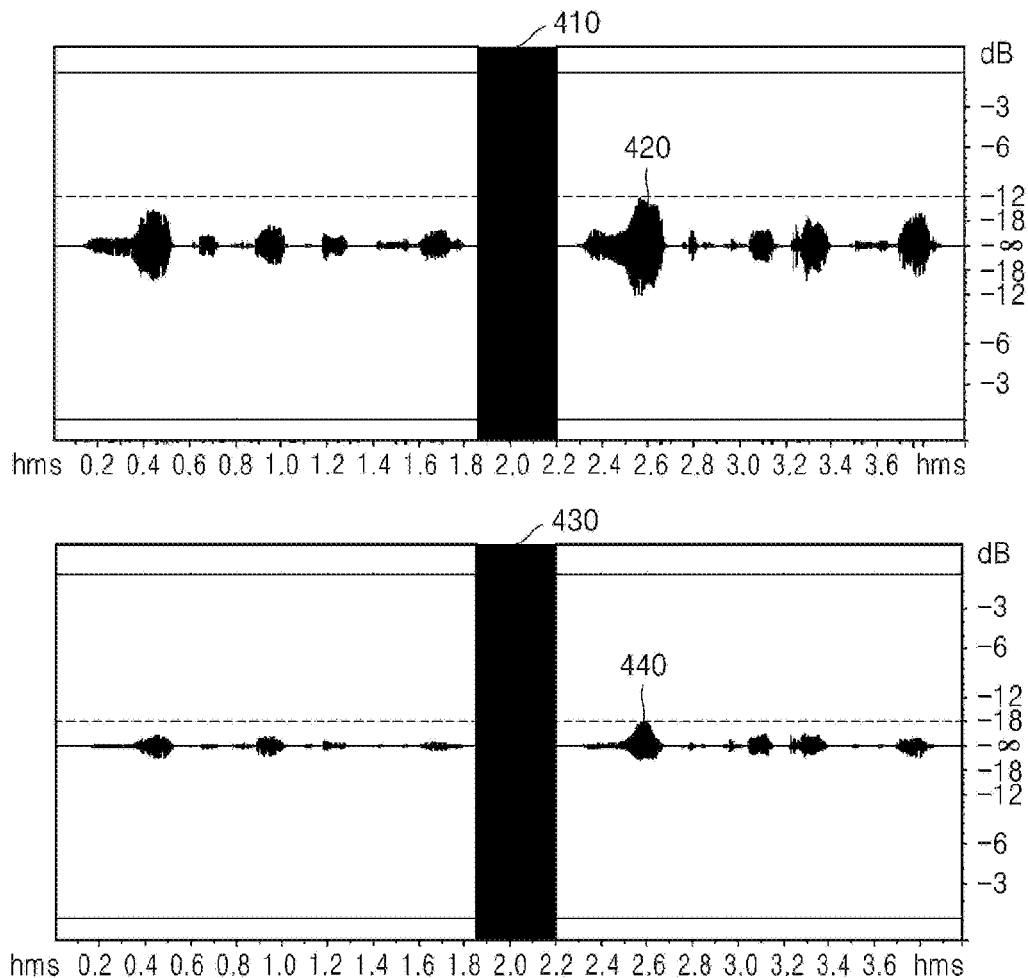
FIG. 4 shows graphs for comparing a received signal before and after passing through the filter unit of FIG. 1 or 2.

FIG. 4 shows graphs for comparing a received signal before and after passing through the filter unit 110 or 220 of FIG. 1 or 2. In the graphs, a horizontal axis indicates time and a vertical axis indicates an energy value.

The upper graph of FIG. 4 shows a received signal, i.e. a decoded PCM signal. Signals 410 and 430 illustrated in pillar shapes in the middle of the upper and lower graphs of FIG. 4 indicate acoustic incident signals and other signals 420 and 440 other than the signals 410 and 430 indicate voice signals.

In FIG. 4, comparing the signal 430 in the lower graph and the signal 410 in the upper graph, it can be seen that energy values of the signals 410 and 430, i.e., the acoustic incident signals, are similar. However, comparing the signals 420 and 440, i.e., the voice signals, it can be seen that an energy value of the signal 440 is lower than an energy value of the signal 420. In other words, the energy value of the voice signal in the low frequency band is decreased by passing through the frequency weighting filter, and the energy value of the acoustic incident signal in the middle and high frequency bands is not decreased.

In order to classify the acoustic incident signal 410 from among the signals by using the upper graph of FIG. 4, an energy value higher than −12 db is used as a reference energy value. On the other hand, in order to classify the acoustic incident signal 430 among the signals by using the lower graph of FIG. 4, an energy value higher than −18 db is used as a reference energy value. In other words, the energy value of the voice signal is lower after being filtered by the filter unit 110 or 220 than before being filtered, and thus a difference between the energy values of the voice signal and the acoustic incident signal increases. Accordingly, the reference energy value used to classify the voice signal from the acoustic incident signal can be decreased.

Figure 5:
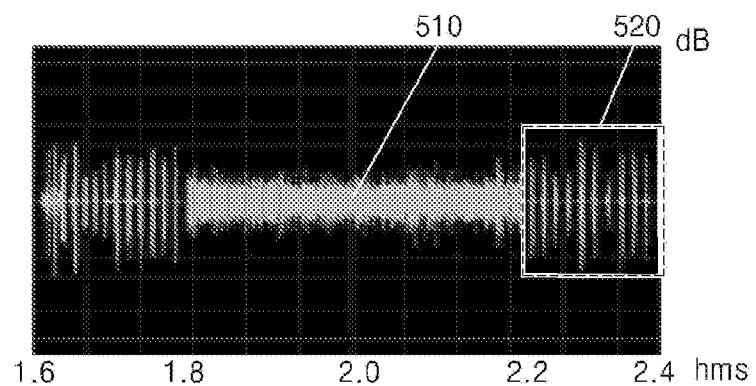
FIG. 5 is a graph showing a signal output from an output unit according to an exemplary embodiment.

FIG. 5 is a graph showing a signal output from the output unit 250 of FIG. 2. In the graph of FIG. 5, a horizontal axis indicates time and vertical axis indicates an energy value.

As described above with reference to FIG. 4, the energy value of the voice signal is lower after being filtered by the filter unit 110 and 220 than before being filtered. Thus, the reference energy value used to identify the acoustic incident signal is decreased. Since the reference energy value is decreased, a gain value, which is a real number between 0 and 1 and used to adjust the energy value of the acoustic incident signal to the reference energy value, is decreased.

Accordingly, when the decreased gain value is applied to the acoustic incident signal from among the received signals, i.e., the decoded PCM signals, the energy value of the acoustic incident signal is decreased to the reference energy value, and the energy value of the voice signal is maintained. Thus, the energy value of the acoustic incident signal is less than the energy value of the voice signal.

Such is illustrated in FIG. 5, wherein signals concentrated in the center indicate acoustic incident signals 510, and signals other than the acoustic incident signals 510 indicate voice signals 520. In FIG. 5, it can be seen that energy values of the acoustic incident signals 510 are less than energy values of the voice signals 520.

Figure 6:
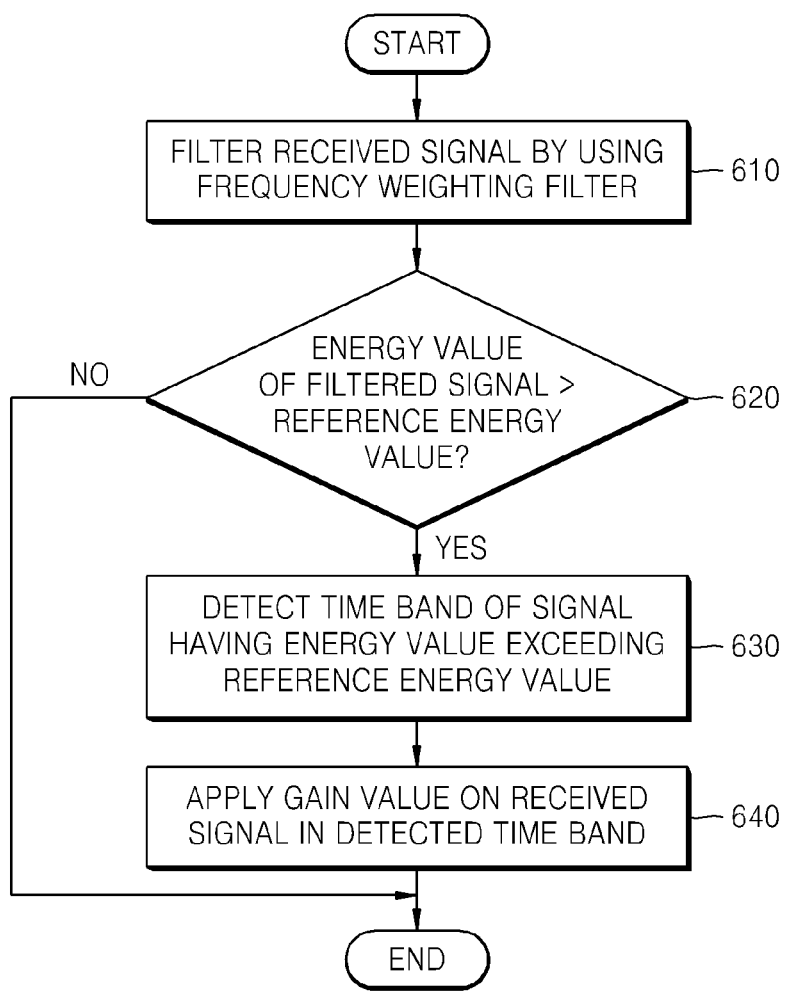
FIG. 6 is a flowchart illustrating a method of removing an acoustic incident signal, according to an exemplary embodiment.

FIG. 6 is a flowchart illustrating a method of removing an acoustic incident signal, according to an exemplary embodiment. Referring to FIG. 6, the apparatus 100 or 200 filters a decoded received signal by using a frequency weighting filter, in operation 610. The frequency weighting filter may give a higher weight from a low frequency band to a high frequency band, and may be applied in a frequency band of 4 KHz or below.

The apparatus 100 or 200 determines whether an energy value of the filtered signal exceeds a reference energy value, in operation 620. Specifically, the apparatus 100 or 200 may obtain an average energy value according to frames of the filtered signal in a time domain. The apparatus 100 or 200 detects a time band of a signal having an average energy value that exceeds the reference energy value, in operation 630. That is, if the average energy value of the filtered signal exceeds the reference energy value, the apparatus 100 or 200 obtains a gain value for adjusting the average energy value of the filtered signal to the reference energy value according to frames.

In operation 640, the apparatus 100 or 200 applies the gain value to the received signal having the time band, in which the average energy value exceeds the reference energy value, according to frames.

According to the exemplary embodiments, an acoustic incident signal generated during a phone call may be efficiently removed.

While not restricted thereto, exemplary embodiments can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, etc. The computer readable recording medium can also be distributed over network coupled computer systems so that the computer readable code is stored and executed in a distributed fashion. Also, functional programs, codes, and code segments for accomplishing exemplary embodiments can be easily construed by programmers skilled in the art to which the present invention pertains. Also, exemplary embodiments may be written as computer programs transmitted over a computer-readable transmission medium, such as a carrier wave, and received and implemented in general-use or special-purpose digital computers that execute the programs. Moreover, while not required in all aspects, one or more units of the apparatus 100 or 200 for removing an acoustic incident signal can include a processor or microprocessor executing a computer program stored in a computer-readable medium.

While aspects have been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of exemplary embodiments, but by the appended claims, and all differences within the scope will be construed as being included in the present invention.

What is claimed is:

1. A method of removing a signal, the method comprising:
   filtering received signals;
   detecting a time band of the filtered received signals where an energy value exceeds a reference energy value; and
   applying, by an apparatus for removing a signal, a gain value to the received signals in the detected time band, wherein
   the detecting the time band comprises:

calculating an average energy value of the filtered received signals in a time domain, according to frames; and detecting a time band of a frame in which the average energy value of the filtered received signals is greater than the reference energy value.

2. The method of claim 1, wherein the filtering the received signals comprises filtering the received signals by using a frequency weighting filter.

3. The method of claim 2, wherein the frequency weighting filter applies increasing weights from a low frequency band to a high frequency band, wherein the weight is a positive real number less than or equal to 1.

4. The method of claim 3, wherein the filtering the received signals by using the frequency weighting filter comprises filtering the received signals in a frequency band of 4 KHz or lower by using the frequency weighting filter.

5. The method of claim 1, further comprising outputting the received signals to which the gain value is applied and remaining received signals, from among the received signals, having an energy value that does not exceed the reference energy value after being filtered, together.

6. The method of claim 1, further comprising:
calculating a value for adjusting the average energy value of the filtered received signals to the reference energy value in the detected time band, according to frames,
wherein the applying the gain value comprises applying the calculated value on the received signals in each frame as the gain value.

7. The method of claim 6, wherein the gain value is a positive real number less than 1.

8. The method of claim 1, further comprising:
decoding the received signals to pulse code modulation (PCM) signals,
wherein the filtering comprises filtering the PCM signals, and the applying the gain value comprises applying the gain value to one or more PCM signals at the detected time band.

9. The method of claim 1, wherein the detecting comprises converting the received signals from a frequency domain to a time domain.

10. An apparatus for removing a signal, the apparatus comprising:
a filter unit for filtering received signals;
an acoustic incident signal section detecting unit for detecting a time band of the filtered received signals where an energy value exceeds a reference energy value; and
a gain applying unit for applying a gain value to each of the received signals in the detected time band,
wherein the acoustic incident signal section detecting unit calculates an average energy value of the filtered received signals in a time domain, according to frames, and detects a time band of a frame in which the average energy value of the filtered received signals is greater than the reference energy value.

11. The apparatus of claim 10, wherein the filter unit filters the received signals by using a frequency weighting filter.

12. The apparatus of claim 11, wherein the frequency weighting filter applies increasing weights from a low frequency band to a high frequency band, wherein the weight is a positive real number less than or equal to 1.

13. The apparatus of claim 12, wherein the filter unit filters the received signals in a frequency band of 4 KHz or lower by using the frequency weighting filter.

14. The apparatus of claim 10, further comprising an output unit which outputs the received signals to which the gain value is applied and remaining received signals, from among the received signals, having an energy value that does not exceed the reference energy value after being filtered, together.

15. The apparatus of claim 10, wherein:
the acoustic incident signal section detecting unit calculates a value for adjusting the average energy value of the filtered received signals to the reference energy value in the detected time band, according to frames; and
the gain applying unit applies the calculated value to the received signals in each frame as the gain value.

16. The apparatus of claim 15, wherein the gain value is a positive real number below 1.

17. A non-transitory computer readable recording medium having recorded thereon a program for executing a method of removing a signal from among received signals, the method comprising:
filtering the received signals;
detecting a time band of the filtered received signals where an energy value exceeds a reference energy value; and
applying a gain value to one or more received signals, from among the received signals, in the detected time band, wherein
the detecting the time band comprises:
calculating an average energy value of the filtered received signals in a time domain, according to frames; and
detecting a time band of a frame in which the average energy value of the filtered received signals is greater than the reference energy value.

18. A method of removing a signal from among received signals, the method comprising:
filtering the received signals;
detecting a time band of the filtered received signals where an energy value exceeds a reference energy value; and
reducing, by an apparatus for removing a signal, a volume of a signal, from among the received signals, at the detected time band to be less than another signal that is not at the detected time band, wherein
the detecting the time band comprises:
calculating an average energy value of the filtered received signals in a time domain, according to frames; and
detecting a time band of a frame in which the average energy value of the filtered received signals is greater than the reference energy value.

19. A non-transitory computer readable recording medium having recorded thereon a program executable by a computer for performing the method of claim 18.

* * * * *